US012002898B2

(12) United States Patent
Luan

(10) Patent No.: US 12,002,898 B2
(45) Date of Patent: Jun. 4, 2024

(54) EMBEDDED WAFER LEVEL OPTICAL SENSOR PACKAGING

(71) Applicant: STMICROELECTRONICS PTE LTD, Singapore (SG)

(72) Inventor: Jing-En Luan, Singapore (SG)

(73) Assignee: STMICROELECTRONICS PTE LTD, Singapore (SG)

( * ) Notice: Subject to any disclaimer, the term of this patent is extended or adjusted under 35 U.S.C. 154(b) by 116 days.

(21) Appl. No.: 17/344,520

(22) Filed: Jun. 10, 2021

(65) Prior Publication Data

US 2021/0399157 A1    Dec. 23, 2021

Related U.S. Application Data

(60) Provisional application No. 63/042,216, filed on Jun. 22, 2020.

(51) Int. Cl.
| | |
|---|---|
| *H01L 31/12* | (2006.01) |
| *H01L 31/02* | (2006.01) |
| *H01L 31/0203* | (2014.01) |
| *H01L 31/18* | (2006.01) |

(52) U.S. Cl.
CPC ........ *H01L 31/12* (2013.01); *H01L 31/02005* (2013.01); *H01L 31/0203* (2013.01); *H01L 31/186* (2013.01)

(58) Field of Classification Search
CPC ...................................................... H01L 31/173
See application file for complete search history.

(56) References Cited

U.S. PATENT DOCUMENTS

| | | | |
|---|---|---|---|
| 8,212,202 B2 | 7/2012 | Wong et al. | |
| 8,455,274 B2 * | 6/2013 | Chen | H01L 33/486 |
| | | | 438/33 |
| 8,604,436 B1 | 12/2013 | Patel et al. | |
| 9,570,648 B2 | 2/2017 | Tharumalingam et al. | |
| 9,590,129 B2 | 3/2017 | Deliwala et al. | |
| 9,684,074 B2 * | 6/2017 | Schrank | H01L 31/167 |
| 9,716,193 B2 | 7/2017 | Sengupta | |
| 9,911,890 B2 | 3/2018 | Renard et al. | |
| 10,061,057 B2 | 8/2018 | Wong et al. | |
| 10,429,509 B2 | 10/2019 | Luan et al. | |
| 2009/0189177 A1 | 7/2009 | Lee et al. | |
| 2012/0104454 A1 * | 5/2012 | Coffy | G02B 13/0085 |
| | | | 257/E33.059 |

* cited by examiner

*Primary Examiner* — Matthew L Reames
(74) *Attorney, Agent, or Firm* — Seed IP Law Group LLP

(57) ABSTRACT

The present disclosure is directed to a sensor die with an embedded light sensor and an embedded light emitter as well as methods of manufacturing the same. The light emitter in the senor die is surrounded by a resin. The sensor die is incorporated into semiconductor device packages as well as methods of manufacturing the same. The semiconductor device packages include a first optically transmissive structure on the light sensor of the sensor die and a second optically transmissive structure on the light emitter of the sensor die. The first optically transmissive structure and the second optically transmissive structure cover and protect the light sensor and the light emitter, respectively. A molding compound is on a surface of a sensor die and covers sidewalls of the first and second optically transmissive structures on the sensor die.

20 Claims, 13 Drawing Sheets

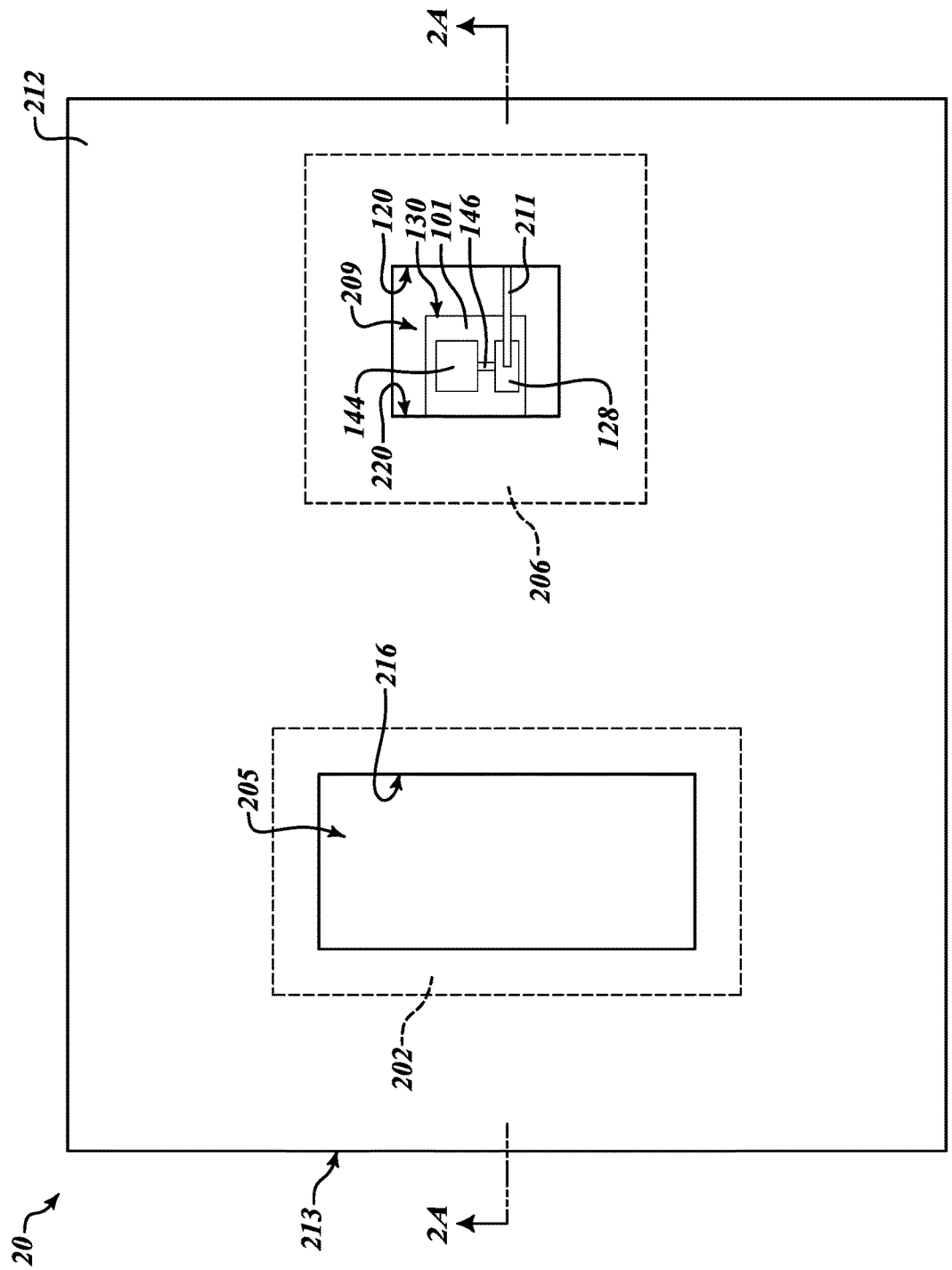

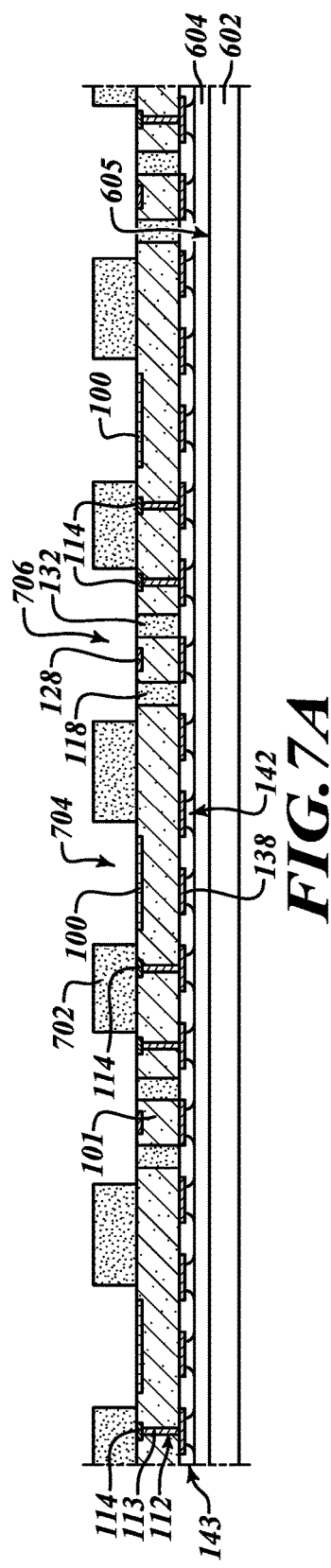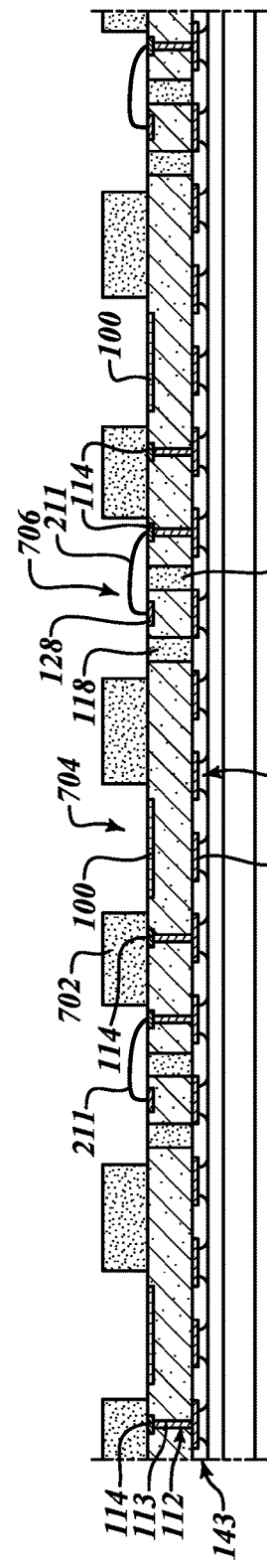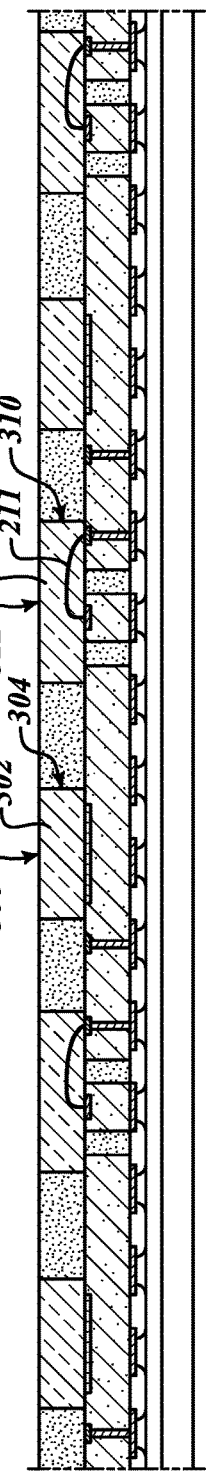

EMBEDDED WAFER LEVEL OPTICAL SENSOR PACKAGING

BACKGROUND

Technical Field

The present disclosure is directed to a die embedded within a substrate, packages including a die embedded within a substrate, and a method of manufacturing the same.

Description of the Related Art

Generally, semiconductor device packages, such as chip scale packages or wafer level chip scale packages (WLCSPs), contain semiconductor devices, such as sensors configured to detect any number of quantities or qualities of an external environment outside the semiconductor packages. For example, such semiconductor device packages may detect light, temperature, sound, pressure, or any other quantities or qualities of an external environment.

A semiconductor device package configured to detect light or proximity of an object to the semiconductor device (e.g., a time of flight (TOF) device) typically utilizes a light emitter device and a light sensor device formed in or on a semiconductor substrate. The semiconductor device package may include a cap coupled to a surface of the substrate to cover and protect the light emitter device and the light sensor device. The cap often is coupled to the surface of the substrate utilizing an adhesive and a pick and place machine. However, it is quite difficult for the pick and place machine to achieve the precise tolerances desired when coupling the cap to the surface of the substrate.

Also, the cap, adhesive, and substrate are made of different materials with different coefficients of thermal expansion (CTEs). This results in the cap, lenses, and substrate expanding or contracting by different amounts when exposed to changes in temperature.

The cap typically includes a first optically transmissive lens aligned with the light emitter and a second optically transmissive lens aligned with the light sensor. The cap forms cavities around the light sensor and the light emitter and is spaced apart from the surface of the die. In some semiconductor device packages, the light emitter and light sensor are formed in respective dies, with the light emitter die stacked on a surface of the light sensor die. This stacked arrangement and the space between the cap and the surface of the light sensor die adds to the overall profile and thickness of the semiconductor device.

There are significant challenges to provide a greater number of semiconductor device packages in electronic devices to perform ever increasing complex functions while at the same time reducing costs of manufacturing and increasing resistance to external stresses to reduce likelihood of failure.

One significant challenge is to reduce the likelihood of failure in semiconductor device packages when exposed to temperature changes due to differences in coefficients of thermal expansion (CTEs) of various materials of the semiconductor device packages. These differences in CTEs cause these various materials to expand and contract by varying amounts. This variability in expansion and contraction increases the likelihood in the formation of cracks and breaks in various electrical and physical connections in the semiconductor device packages. For example, an adhesive coupling a cap to a surface of a substrate in a semiconductor device package is a point of weakness when the semiconductor device package expands and contracts as there is a high likelihood that cracking could occur in the adhesive resulting in the cap becoming misaligned or breaking off altogether.

BRIEF SUMMARY

Embodiments of the present disclosure may overcome significant challenges associated with semiconductor device packages that utilize a cap as discussed above.

The present disclosure is directed to various embodiments of semiconductor device packages including a sensor die having a light sensor and a light emitter as well as methods of manufacturing the same. The light emitter is positioned within an opening in the sensor die and is surrounded by a resin. In some embodiments, the light emitter may be a semiconductor die, a light emitting diode device, or some other light-emitting device. Optically transmissive structures are placed on or formed on the light emitter and the light sensor to cover and protect the light sensor and the light emitter.

A bonding wire is in the optically transmissive structure on the light emitter and couples the light emitter to an electrical connection in the sensor die.

In some embodiments, a molding compound is formed on sidewalls of the optically transmissive structures, on a surface of the sensor die, and a surface of the molding compound is substantially coplanar with surfaces of the optically transmissive structures. In some other embodiments, a molding compound is formed on sidewalls of the optically transmissive structures, on surfaces of the optically transmissive structures transverse to the sidewalls of the optically transmissive structures, and on the surface of the sensor die.

BRIEF DESCRIPTION OF THE SEVERAL VIEWS OF THE DRAWINGS

For a better understanding of the embodiments, reference will now be made by way of example to the accompanying drawings. In the drawings, identical reference numbers identify similar elements or acts unless the context indicates otherwise. The sizes and relative portions of the elements in the drawings are not necessarily drawn to scale. For example, some of these elements may be enlarged and positioned to improve drawing legibility.

FIG. 2B is a top plan view of the embodiment of the package in FIG. 2A;

FIGS. 7A-7E show a flowchart of a method of manufacturing the embodiment of the package in FIGS. 3A-3B.

DETAILED DESCRIPTION

In the following description, certain specific details are set forth in order to provide a thorough understanding of various embodiments of the disclosure. However, one skilled in the art will understand that the disclosure may be practiced without these specific details. In other instances, well-known structures associated with electronic components and semiconductor fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The term "left," "right," "top," and "bottom" are used for only discussion purposes based on the orientation of the components in the discussion of the Figures in the present disclosure as follows. These terms are not limiting as the possible positions explicitly disclosed, implicitly disclosed, or inherently disclosed in the present disclosure.

The term "substantially" is used to clarify that there may be slight differences when a package is manufactured in the real world, as nothing can be made perfectly equal or perfectly the same. In other words, substantially means that there may be some slight variation in actual practice and instead is made within accepted tolerances.

As used in this specification and the appended claims, the singular forms "a," "an," and "the" include plural referents unless the content clearly dictates otherwise.

While various embodiments are shown and described with respect to semiconductor die and semiconductor packages, it will be readily appreciated that embodiments of the present disclosure are not limited thereto. In various embodiments, the structures, devices, methods and the like described herein may be embodied in or otherwise utilized in any suitable type or form of semiconductor die or packages, and may be manufactured utilizing any suitable semiconductor die and packaging technologies as desired.

Figure 1A:
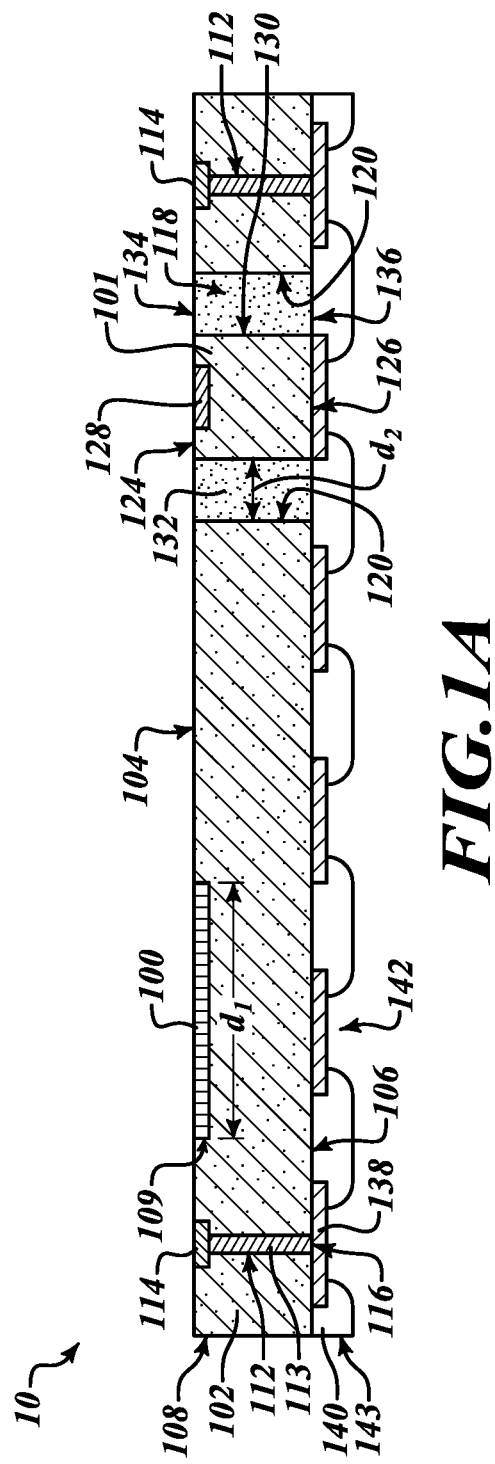
FIG. 1A is a cross-sectional view of an embodiment of a die taken along line 1A-1A in FIG. 1B.
Figure 1B:
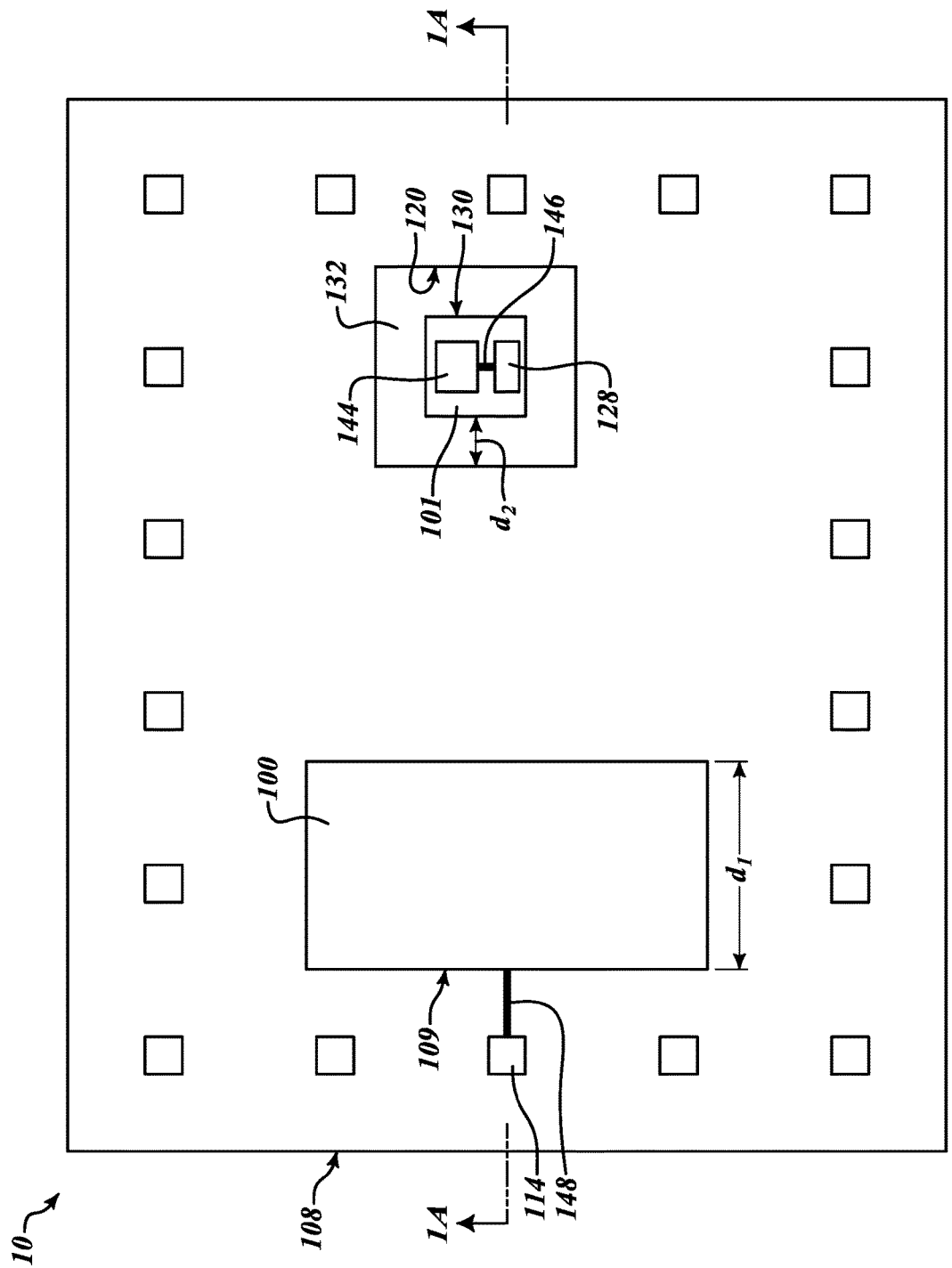
FIG. 1B is a top plan view of the embodiment of the die in FIG. 1A.

An optical sensing device 10 according to one embodiment is shown in FIGS. 1A and 1B. The optical sensing device 10 includes both a light sensor 100 and a light emitter 101 embedded in a semiconductor substrate 102. The light sensor 100 and the light emitter 101 include surfaces substantially co-planar or flush with each other and substantially coplanar or flush with a surface of the semiconductor substrate 102. For example, the optical sensing device 10 may be a time-of-flight (TOF) distance sensor that senses distance to an object based on the time it takes to direct light from the light emitter 101 to the object and for the light sensor 100 to receive the light reflected off the object. Alternatively, the optical sensing device 10 may be a camera or other image sensing device.

FIG. 1A is a cross-sectional view of an embodiment of the optical sensing device 10 taken along line 1A-1A in FIG. 1B. The substrate 102 is a sensor die and has a first surface 104 and a second surface 106 opposite to the first surface 104. The first surface 104 may be referred to as a top surface and the second surface 106 may be referred to as a bottom surface based on the orientation of the optical sensing device 10 in FIG. 1A. Sidewalls 108 of the substrate 102 are transverse to the first surface 104 and the second surface 106 of the substrate 102. The sidewalls 108 extend from the first surface 104 to the second surface 106 of the substrate 102.

The light sensor 100 is embedded in the first surface 104 of the substrate 102. The light sensor 100 has ends 109 at which the light sensor 100 terminates within the first surface 104 of the substrate 102, and the light sensor 100 has a dimension $d_1$ that extends between the ends 109 of the light sensor 100. In some embodiments, the light sensor 100 may be on the first surface 104 of the substrate 102 or extend outwards from the first surface 104 of the substrate. The light sensor 100 may be a photoelectric sensor, a microelectromechanical system (MEMS) sensor, or some other light sensor that detects light.

A plurality of electrical connections 112 are in the substrate 102. The electrical connections 112 extend from the first surface 104 to the second surface 106 of the substrate 102. Each electrical connection 112 includes a conductive via 113 that extends between a pad 114 on the first surface 104 of the substrate 102 to the second surface 106 of the substrate 102. The electrical connections 112 may be electrical vias, electrical interconnect structures, or some other electrical connection or combination of electrical connections configured to pass electrical signals from and to various components of a die or a package. The electrical connections 112 may be made of a single electrically conductive material or may be made of a number of electrically conductive materials. The conductive materials may be a copper material, a silver material, a gold material, an alloy material, or some other electrically conductive material or combination of electrically conductive materials.

The substrate 102 includes an opening 118 for receiving the light emitter 101. The opening 118 may be a cavity, a hole, a trench, or some other type of opening that extends through or into the substrate 102. The opening 118 includes sidewalls 120 transverse to the first surface 104 and the second surface 106 of the substrate 102. The opening 118 extends through the substrate 102 from the first surface 104 to the second surface 106. In some other embodiments, the opening 118 may have an end that terminates within the substrate 102 before reaching the second surface 106. However, the preferred embodiment will include the opening 118 extending from the first surface 104 to the second surface 106 of the substrate 102 as shown in FIG. 1A.

The light emitter 101 is positioned within the opening 118 and may be at a center of the opening 118. The light emitter 101 has a first surface 124, and a second surface 126 that is opposite to the first surface 124. The first surface 124 emits light and may be referred to as an emitting surface, and the second surface 126 does not emit light and may be referred to as a non-emitting surface. The first surface 124 is substantially coplanar with the first surface 104 of the substrate 102. The second surface 126 is substantially coplanar with the second surface 106 the substrate 102.

The light emitter 101 includes a bonding pad 128 on the emitting surface 124. While not shown for simplicity and brevity sake, a bonding pad or a plurality of bonding pads may be on the second surface 126 of the light emitter 101. The bonding pad or pads that may be on the second surface 126 of the light emitter 101 may be coupled to the bonding pad 128 on the first surface 124 of the light emitter 101 by an electrical trace, a plurality of electrical traces, an electrical via, a plurality of electrical vias, or some other electrical connection or combination of electrical connections within the light emitter 101.

The light emitter 101 includes sidewalls 130 that are transverse to the first surface 124 and second surface 126 of the light emitter 101. The sidewalls 130 are spaced apart from sidewalls 120 of the opening 118 by a space with a dimension $d_2$. The dimension $d_2$ may be any dimension as selected to separate the light emitter 101 from the sidewalls 120 of the opening 118. In some embodiments, some or all of the sidewalls 130 of the light emitter 101 may contact the sidewalls 120 of the opening 118.

A resin 132 is in the opening 118 and fills the space between the sidewalls 120 of the opening 118 and the sidewalls 130 of the light emitter 101 such that the resin 132 has a thickness $d_2$. In a preferred embodiment, the resin 132 is an optically non-transmissive material and may be a black resin, a black molding compound, a black epoxy, or some other optically non-transmissive material or combination of optically non-transmissive materials. In some other embodiments, the resin 132 may be optically transmissive or semi-transmissive and a molding compound, an epoxy, or some other resin or combination of resins to help in the formation of a package. The resin 132 covers the sidewalls 120, 130 and extends between the first and second surfaces 104, 106 of the substrate 102. The resin 132 includes a first surface 134, substantially co-planar with the first surface 104 of the substrate 102, and a second surface 136 substantially co-planar with the second surface 106 of the substrate 102.

A plurality of contacts 138 are on the second surface 106 of the substrate 102 to mount or couple the optical sensing device 10 to an external electronic component or within an electronic device. Some of the contacts 138 may be coupled to ends 116 of the conductive vias 113 of the electrical connections 112 at the second surface 106 of the substrate 102. The contacts 138 are electrically conductive and may be made of copper, silver, gold, an alloy material, or some other electrically conductive material or combination of electrically conductive materials. Some of the electrical contacts 138 may be coupled to bonding pads on the second surface 126 of the light emitter 101, and some may be coupled to the light sensor 100. The contacts 138 may mount or couple the optical sensing device 10 to an external electronic component or within an electronic device through a conductive material, such as a solder, which will be discussed in greater detail later. For example, the optical sensing device 10 may be mounted to a printed-circuit board (PCB), an electrical interconnect structure, or some other external electronic component configured to communicate electrical signals to and from electrical components.

A nonconductive layer 140 is on the second surface 106 of the substrate 102 and on the contacts 138. The nonconductive layer 140 may be made of any insulating material, a passivation material, a re-passivation material, a dielectric material, or any combination of electrically nonconductive materials. The nonconductive layer 140 includes a plurality of openings 142 that respectively expose the contacts 138. Sidewalls 143 of the nonconductive layer 140 are substantially co-planar with the sidewalls 108 of the substrate 102.

FIG. 1B is a top-plan view of the optical sensing device 10 shown in FIG. 1A. The light emitter 101 includes an emitter 144 on the emitting surface 124 of the light emitter 101. The emitter 144 may be a laser diode (LD), a light-emitting diode (LED), a vertical cavity surface emitting laser (VCSEL), or some other light-emitting device configured to emit light. The emitted light may be a visible light, an infrared light, or some other type of light that the emitter 144 is configured to emit.

An electrical connection 146 couples the bonding pad 128 to the emitter 144. The electrical connection 146 may be an electrical trace, a plurality of electrical traces, an interconnect structure, or some other electrical connection or combination of electrical connections that extend along and on the emitting surface 124 of the light emitter 101. In some embodiments, the electrical connection 146 may extend within the light emitter 101 from the bonding pad 128 to the emitter 144.

An electrical connection 148 couples one of the plurality of pads 114 to the light sensor 100 as shown on the left hand side of FIG. 1A. The electrical connection 148 may be an electrical trace, a plurality of electrical traces, an interconnect structure, or some other electrical connection or combination of electrical connections that extend along and on the first surface 104 of the substrate 102. In some other embodiments, the electrical connection 148 may extend within the light emitter 100 from the bonding pad to the emitter 144. In some embodiments, a number of the pads of the plurality of pads 114 may be coupled to the light sensor 100. The plurality of pads 114 may be referred to as a plurality of contact pads, a plurality of bonding pads, or some other type of pad for forming electrical connections.

As discussed earlier, the optical sensing device 10 may be a TOF distance sensor that senses distance to an object based on the time it takes to direct light from the light emitter 101 to the object and for the light sensor 100 to receive the light reflected off the object. When the optical sensing device 10 is a TOF distance sensor, the emitter 144 emits light, the light reflects off of the object, and reflected light is received by the light sensor 100. The optical sensing device 10 outputs data collected by the light sensor 100 with respect to the reflected beam of light received by the light sensor 100 and outputs data with respect to the light beam emitted by the emitter 144. A processor coupled to the optical sensing device 10 uses this data to determine proximity of the object to the optical sensing device 10. Alternatively, the optical sensing device 10 may include an internal processor that determines the proximity of the object to the optical sensing device 10 instead of outputting the data to an external processor.

Figure 2A:
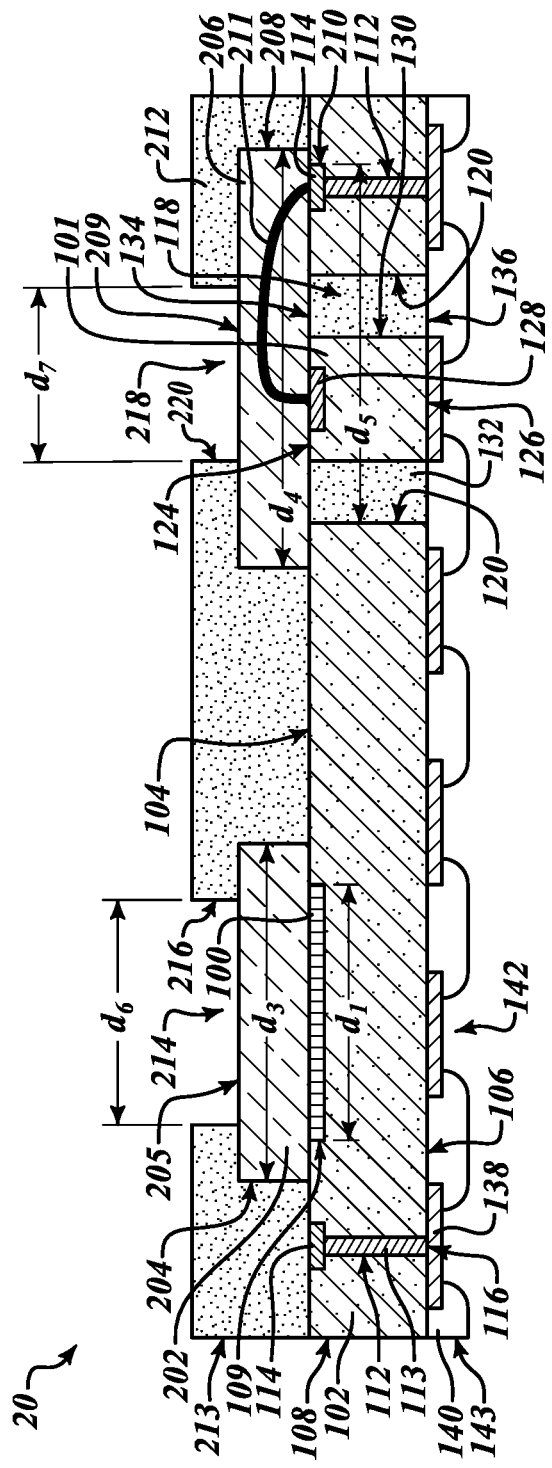
FIG. 2A is a cross-sectional view of an embodiment of a package taken along line 2A-2A in FIG. 2B.

FIGS. 2A-2B are directed to an embodiment of a semiconductor package 20 that includes the optical sensing device 10 as shown in FIGS. 1A-1B.

FIG. 2A is a cross-sectional side view of the embodiment of the semiconductor package 20 taken along a line 2A-2A in FIG. 2B and FIG. 2B is a top-plan view of the semiconductor package 20.

The semiconductor package 20 includes a first optically transmissive structure 202 on the light sensor 100. The first optically transmissive structure 302 exposes the light sensor 100 to light from an external environment. The first optically transmissive structure 202 includes sidewalls 204 that are transverse to the first surface 104 of the optical sensing device 10. An upper surface 205 of the first optically transmissive structure 202 extends between the sidewalls 204. The first optically transmissive structure 202 has a dimension $d_3$ between the sidewalls 204 that is greater than a dimension $d_1$ of the light sensor 100 and entirely covers the light sensor 100. This enables the first optically transmissive structure 202 to protect the light sensor 100 from debris. In some other embodiments, the dimension $d_3$ may be substantially equal to the dimension $d_1$ or less than the dimension $d_1$.

A second optically transmissive structure 206 is on the light emitter 101. The second optically transmissive structure 206 exposes the light emitter to the external environment. The second optically transmissive structure 206 includes sidewalls 208 transverse to the first surface 104 of the optical sensing device 10, and an upper surface 209 transverse to the sidewalls 208. The second optically transmissive structure 206 has a dimension $d_4$ between the sidewalls 208 that is greater than a dimension $d_5$ that extends from the left sidewall 120 of the opening 118 to an end 210 of the pad 114 to the right of the light emitter 101 in FIG. 2A. This enables the second optically transmissive structure 206 to protect the light emitter 101 from debris. In some other embodiments, the dimension $d_4$ may be substantially equal to or less than the dimension $d_5$.

The optically transmissive structures 202, 204 are made of a material that allows light (e.g., infrared, visible, ultraviolet, etc.) to pass through them. For example, the optically transmissive structures 202, 204 may be made of a glass material, a silicon material, or some other optically transmissive material or combination of optically transmissive materials.

A bonding wire 211 is embedded in the second optically transmissive structure 206. The bonding wire 211 includes first end coupled to the bonding pad 128 of the light emitter 101 and a second end coupled to the pad 114 to the right of the light emitter in FIG. 2A. The bonding wire 211 passes signals from the light emitter 101 to the electrical connection 112 on the right-hand side of the light emitter 101 in FIG. 2A or vice versa. For example, the bonding wire 211 may supply control signals to the light emitter 101 from an external controller, output error signals to an external controller, or transmit some other signal or combination of signals.

The semiconductor package 20 includes a molding compound 212 on the first surface 104 of the optical sensing device 10, the sidewalls 204 of the first optically transmissive structure 202, and the sidewalls 208 of the second optically transmissive structure 206. The molding compound 212 partially covers the upper surfaces 205, 209 of the first and second optically transmissive structures 202, 206, respectively. Sidewalls 213 of the molding compound 212 are substantially co-planar with the sidewalls 108 of the substrate 102. The molding compound 212 may be an epoxy material, a resin material, an insulating material, or some other type of molding compound or combination of molding compounds. The molding compound 212 is an optically non-transmissive material that light cannot pass through. For example, the molding compound 212 may be a black molding compound, a black epoxy, a black resin, or some other optically non-transmissive material or combination of optically non-transmissive materials.

A first opening 214 in the molding compound 212 exposes the surface 205 of the first optically transmissive structure 202. Light passes through the first optically transmissive structure 202, enters the semiconductor package 20, and is received by the sensor 100. The first opening 214 has dimension $d_6$ that extends between sidewalls 216 of the first opening 214. The dimension $d_6$ is less than the dimension $d_3$ and the dimension $d_1$. In some embodiments, the dimension $d_6$ may be greater than or equal to the dimension $d_1$, or may be substantially equal to the dimension $d_3$. When the dimension $d_6$ is substantially equal to the dimension $d_3$, the sidewalls 216 of the first opening 214 will be substantially co-planar with the sidewalls 204 of the first optically transmissive structure 202

A second opening 218 in the molding compound 212 exposes the surface 209 of the second optically transmissive structure 206. Light emitted by the light emitter 101 passes through the second optically transmissive structure 206 and the second opening 218 to leave the semiconductor package 20. The second opening 218 has a dimension $d_7$ that extends between sidewalls 220 of the second opening 218. The dimension $d_7$ is less than the dimension $d_5$ and the dimension $d_4$. In some embodiments, the dimension $d_7$ may be greater than the dimension $d_5$, may be substantially equal to the dimension $d_5$, or may be substantially equal to the dimension $d_4$. When the dimension $d_7$ is substantially equal to the dimension $d_4$, the sidewalls 220 of the second opening 218 will be substantially co-planar with the sidewalls 208 of the second optically transmissive structure 206.

The top-down view of the semiconductor package 20 in FIG. 2B shows the upper surface of the molding compound 212 and the upper surfaces 205, 209 of the first and second optically transmissive structures 202, 206. The dashed lines in FIG. 2B are representative of portions of the first optically transmissive structure 202 and portions of the second optically transmissive structure 206 that are covered by the molding compound 212.

Figure 3A:
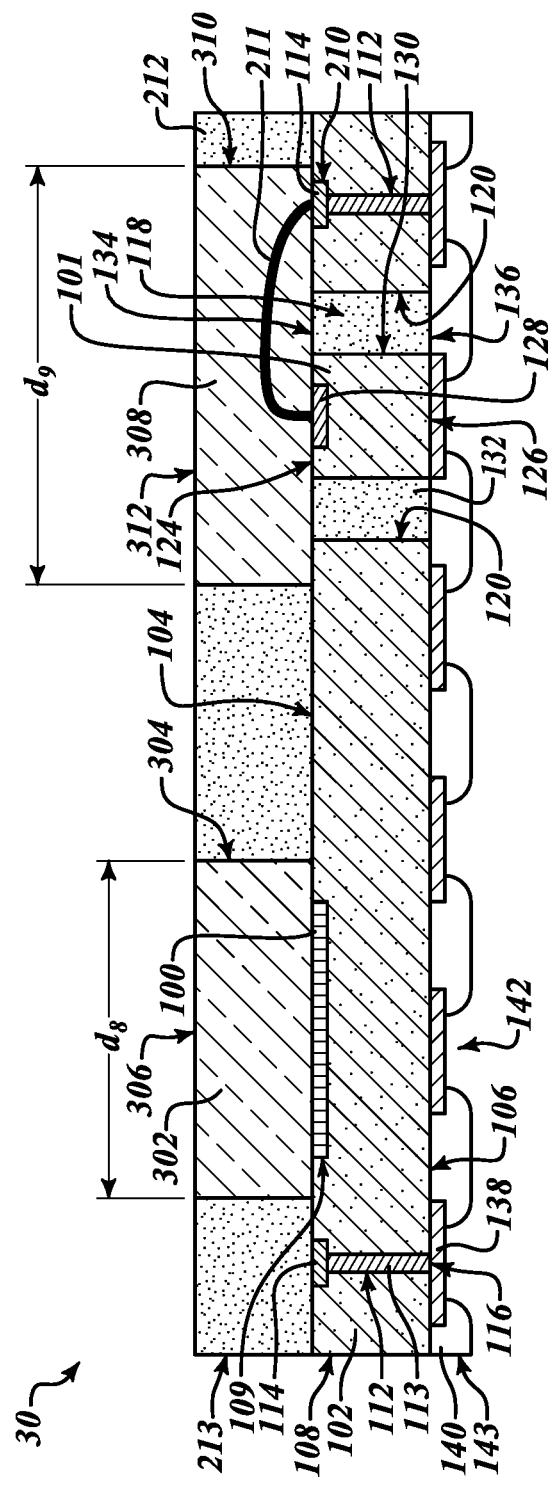
FIG. 3A is a cross-sectional view of an embodiment of a package taken along line 3A-3A in FIG. 3B.
Figure 3B:
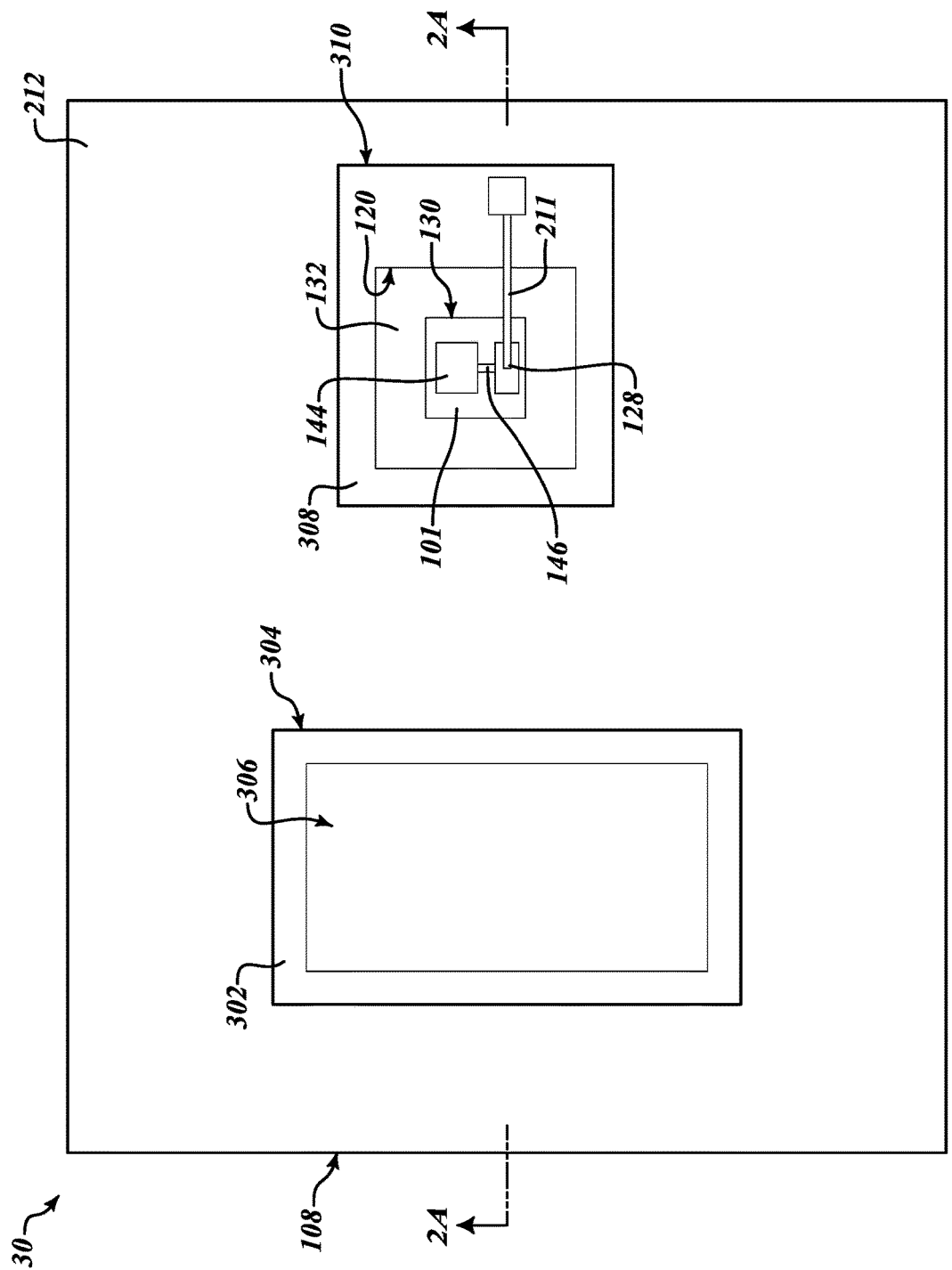
FIG. 3B is a top plan view of the embodiment of the package in FIG. 3A.

FIGS. 3A-3B are directed to an another embodiment of a semiconductor package 30 that includes the optical sensing device 10 as shown in FIGS. 1A-1B and that has similar features to the embodiment of the package 20 as shown in FIGS. 2A-2B. The main difference is that the package 30 has first and second optically transmissive structures 302, 308 that extend to the upper surface of the molding compound 212, while the first and second optically transmissive structures 202, 206 are partially covered by the molding compound 212 in FIGS. 2A-2B.

The first optically transmissive structure 302 is on the light sensor 100 and exposes the light sensor 100 to light from the external environment. The first optically transmissive structure 302 has sidewalls 304 and an upper surface 306 that extends between the sidewalls 304. The first optically transmissive structure 302 has a dimension $d_8$ between the sidewalls 304 that is greater than the dimension $d_1$. In some embodiments, the dimension $d_8$ may be substantially equal to the dimension $d_1$.

The second optically transmissive structure 308 is on the light emitter 101 and exposes the light emitter 101 to the external environment. The second optically transmissive structure 308 has sidewalls 310 and an upper surface 312 that extends between the sidewalls. The second optically transmissive structure 308 has a dimension $d_9$ between the sidewalls 310 that is greater than the dimension $d_5$. In some embodiments, the dimension $d_9$ may be substantially equal to the dimension $d_5$.

The molding compound 212 is on the sidewalls 304 of the first optically transmissive structure 302 and on the sidewalls 310 of the second optically transmissive structure 308. The molding compound 212 is substantially co-planar with the upper surface 306 of the first optically transmissive structure 302 and with the upper surface 312 of the second optically transmissive structure 312.

The optically transmissive structures 302, 308 are made of a material that allows light (e.g., infrared, visible, ultraviolet, etc.) to pass through them. For example, the optically transmissive structures 202, 204 may be made of a transparent material, a glass material, a silicon material, or some other transmissive material or combination of transmissive materials.

Figure 4:
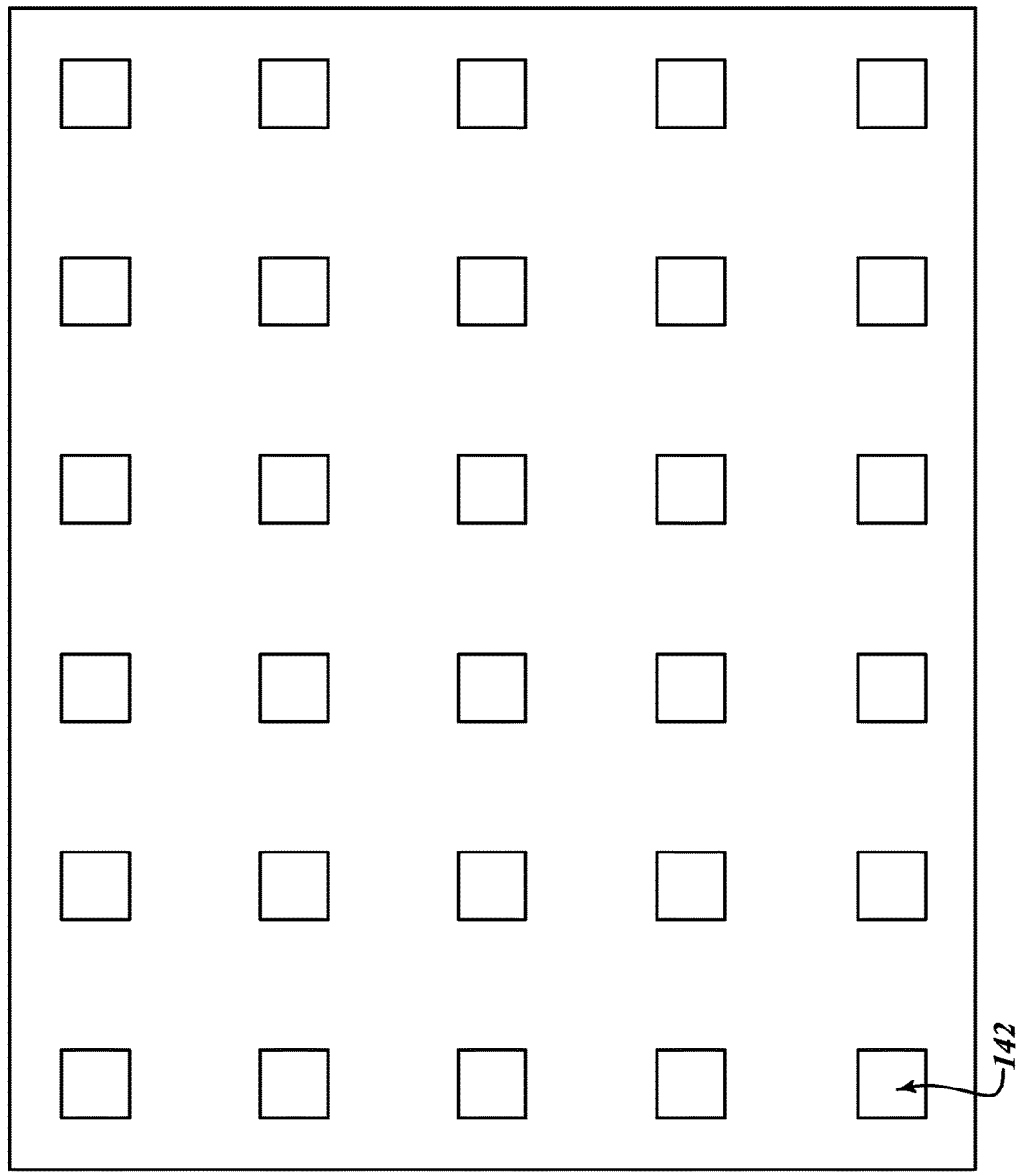
FIG. 4 is a bottom plan view of the embodiment of the die and the embodiments of the package in FIGS. 1A-3B.

FIG. 4 is bottom-plan view representative of a mounting surface of the optical sensing device 10 and the packages 20, 30 based on the orientations of the optical sensing device 10 in FIGS. 1A-1B and the packages 20, 30 in FIGS. 2A-3B. The contacts 138 are arranged in an array and are utilized to mount the optical sensing device 10 and the packages 20, 30 within an electronic device or on a PCB using a conductive material, such as solder. The contacts 138 have a square shape in FIG. 4, but may be circular, triangular, rectangular, or some other shape or combinations of shapes.

FIGS. 5A-5G are cross-sectional views of a method of manufacturing of the optical sensing device 10 as shown in FIGS. 1A-1B. These cross-sectional views of this embodiment of the method of manufacturing the optical sensing device 10 are taken along a line similar to line 1A-1A in FIG. 1B with respect to the optical sensing device 10. Features in this embodiment that are the same or similar to the features shown in the optical sensing device 10 in FIGS. 1A-1B are represented by the same reference numerals in FIGS. 5A-5G.

Figure 5A:
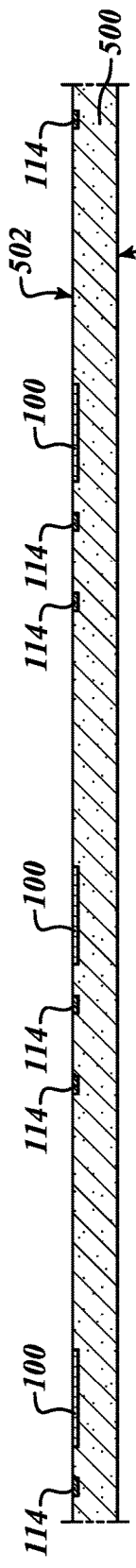
FIGS. 5A-5H show a flowchart of a method of manufacturing the embodiment of the die in FIGS. 1A-1B.

FIG. 5A is a cross-sectional view of a wafer 500 that includes a first surface 502 and a second surface 504 opposite to the first surface 502. A plurality of the light sensors 100 and a plurality of the pads 114 are formed at the first surface 502 of the wafer 500.

Figure 5B:
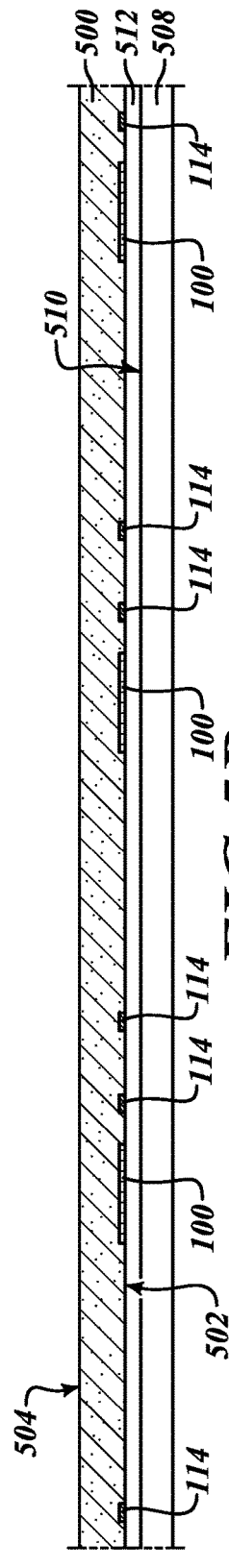

In FIG. 5B the wafer 500 is temporarily coupled to a surface 510 of a support 508. The support 508 may be a kapton tape, a dummy wafer, a dummy substrate, a leadframe tape, or some other support. The adhesive 512 is formed on the surface 510 of the support 508 and the wafer 500 is placed on the adhesive 512 to couple the first surface 502 of the wafer 500 to the surface 510 of the support 508. In some other embodiments, the adhesive 512 may be already pre-formed on the surface 510 of the support 508. The adhesive 512 may be a die attach film (DAF), a glue, a decomposable adhesive, or some other adhesive. The adhesive 512 may be formed by a sputtering technique, a lamination technique, or some other adhesive formation technique. The wafer 500 may be placed on the adhesive 512 by a pick and place machine technique, a flip chip technique, or some other placement technique or positioning technique.

Figure 5C:
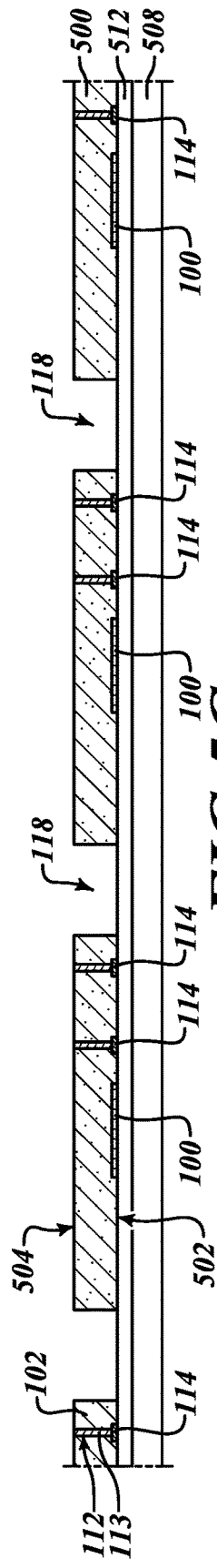

After coupling the wafer 500 to the support 508 in FIG. 5B, a plurality of the electrical connections 112 and a plurality of the openings 118 are formed in the wafer 500 in FIG. 5C.

The electrical connections 112 are formed by first forming a plurality of holes that extend into the second surface 504 of the wafer 500 and expose the pads 114. The holes may by formed by an etching technique, a drilling technique, or some other formation technique. After forming the holes, an electrically conductive material is deposited to fill the holes, forming vias 113 of the electrical connections 112. The electrically conductive material may be formed in the holes by injection technique, compression, reflow, or some other electrically conductive material formation technique or combination of formation techniques.

The openings 118 are formed between at least one of the pads 114 and at least one of the light sensors 100. The openings 118 may be formed by etching, drilling, or some other opening formation technique. The openings 118 extend completely from the first surface 502 to the second surface 504 of the wafer 500.

Figure 5D:
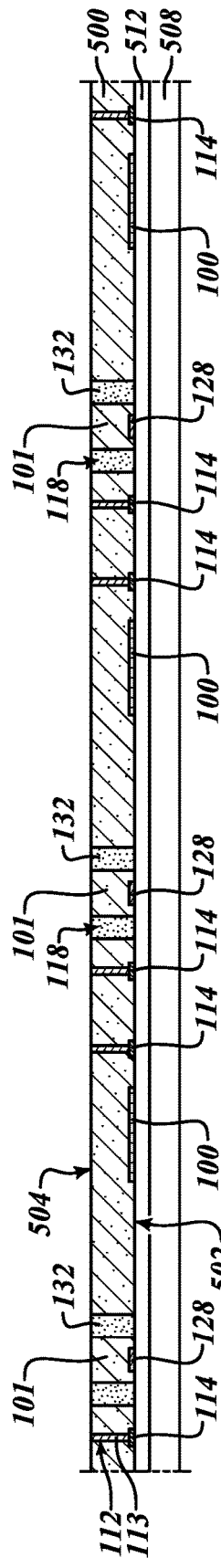

After forming the openings 118 and the electrical connections 112, the light emitters 101 are placed in the openings 118 and the resin 132 is formed around the light emitters 101 in the openings 118, which can be seen in FIG. 5D. The light emitters 101 may be placed in the openings 118 by a pick and place machine. The light emitters 101 are positioned substantially at a center of the openings 118. The emitting surfaces 124 of the light emitters 101 are placed on the adhesive 512 coupling the light emitters 101 to the support 508. In some embodiments, the light emitters 101 may be placed to be offset from the centers of the openings 118, and may be placed such that sidewalls 130 of the light emitters 101 contact the sidewalls 120 of the openings 118.

After the light emitters 101 are placed in the openings 118, the resin 132 is formed in the spaces between the sidewalls 130 of the light emitters 101 and the sidewalls of the openings 118. The resin 132 may be formed by injection, compression, or some other resin formation technique.

Figure 5E:
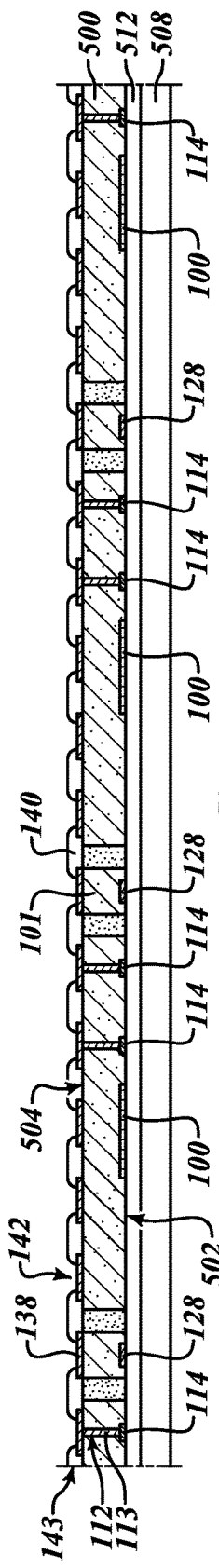

After forming the light emitters 101 and the resin 132 in the openings 118, the contacts 138 and the nonconductive layer 140 are formed on the second surface 504 of the wafer 500 in step 518, which can be seen in FIG. 5E.

The contacts 138 are formed by depositing an electrically conductive layer on the second surface 504 of the wafer 500. The conductive layer is selectively etched to remove portions of the conductive layer and form the contacts 138. The etching may be a photoresist etching, a chemical etching, a dry etching, or some other etching technique. In some embodiments, portions of the conductive layer may be removed by a sawing, drilling, grinding, or some other removal technique.

The nonconductive layer 140 is formed on the plurality of contacts 138 and the second surface 504 of the wafer 500. The nonconductive layer 140 is formed to fill spaces between the contacts 138. The nonconductive layer 140 may be formed by deposition, sputtering, lamination, or some other nonconductive layer formation technique.

Figure 5F:
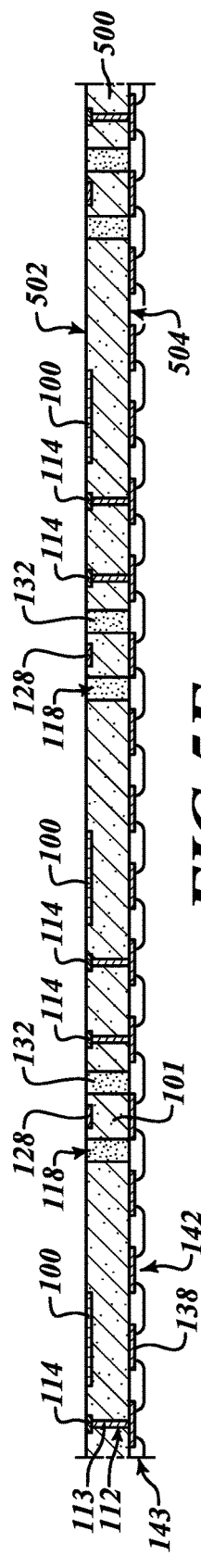

After forming the contacts 138 and the nonconductive layer 140, the adhesive 512 and support 508 are removed from the wafer 500, which can be seen in FIG. 5F. The adhesive and the support 508 may be removed using a pick and place machine. In some embodiments, the adhesive 512 may be a decomposable adhesive that is decomposed to remove the support 508 from the wafer 500. For example, the adhesive 512 may be a water decomposable adhesive, a chemical decomposable adhesive, a light decomposable adhesive, or some other decomposable adhesive.

Figure 5G:
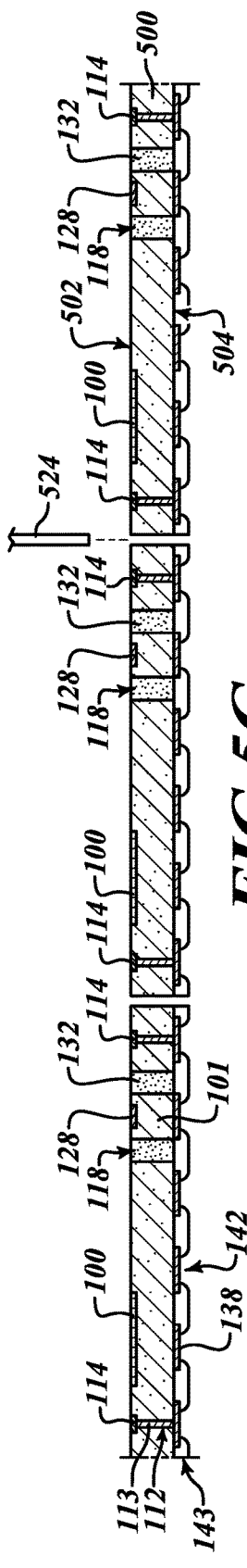

After removing the adhesive 512 and support 508, the wafer 500 is singulated into a plurality of the optical sensing devices 10 as shown in FIG. 5G. The wafer 500 is singulated between the electrical connections 112 in the wafer 500 and is singulated by a singulation device 524. The singulation device 524 may be a saw, a laser, a cutter, or some other singulation device.

Figure 5H:
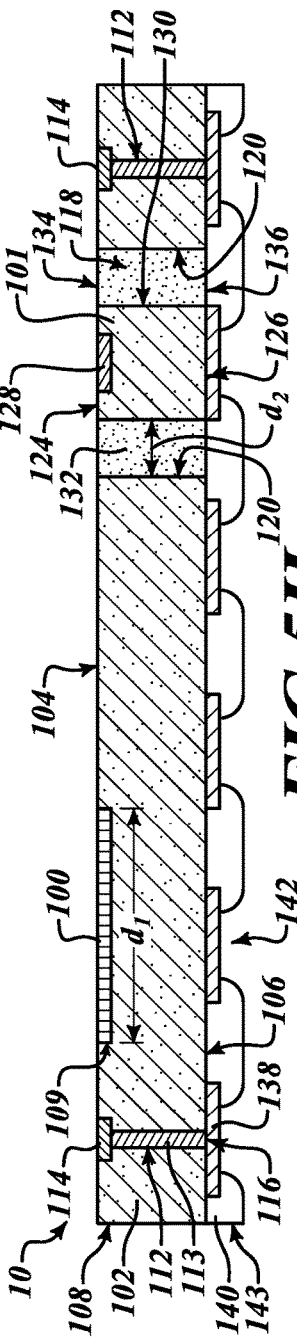

FIG. 5H shows one of the optical sensing devices 10 formed by singulating the wafer 500.

FIGS. 6A-6E are cross-sectional views of a method of manufacturing of a plurality of the packages 20 as shown in FIGS. 2A-2B. These cross-sectional views of this embodiment of the method of manufacturing are taken along a line similar to the line 2A-2A in FIG. 2B with respect to the package 20. The features of this embodiment that are the same or similar to the package 20 in FIGS. 2A-2B are represented by the same reference numerals in FIGS. 6A-6E. In this method, the same steps are followed as in the method of manufacturing the optical sensing devices 10 in FIGS. 5A-5F.

Figure 6A:
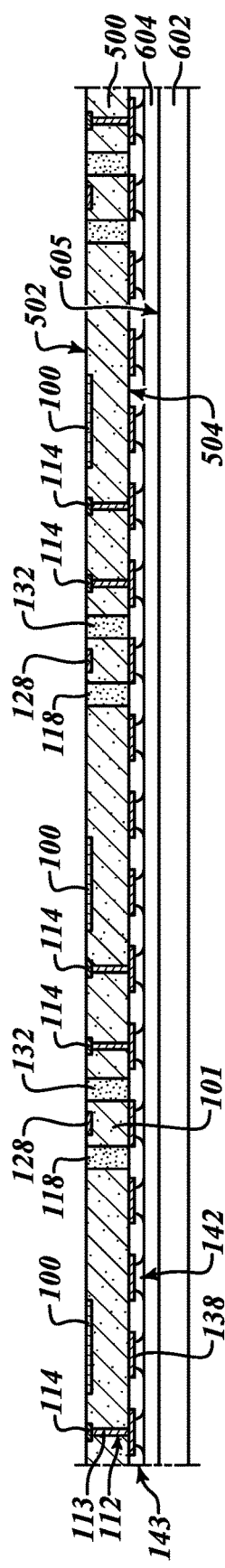
FIGS. 6A-6E show a flowchart of a method of manufacturing the embodiment of the package in FIGS. 2A-2B.

After removing the adhesive 512 and the first support 508, the nonconductive layer 140 on the second surface 504 of the wafer 500 is temporarily coupled to a second support 602 by an adhesive 604, which can be seen in FIG. 6A. The support 602 may be a kapton tape, a dummy wafer, a dummy substrate, a leadframe tape, or some other support. The adhesive 604 may be a DAF, a glue, a decomposable adhesive, or some other adhesive. The adhesive 604 is formed on a surface 605 of the support 602. The adhesive 604 is formed on the surface 605 the support 602 in a similar fashion as the adhesive 512 was formed on the surface 510 of the support 508 as shown in FIG. 5B. In some other embodiments, the adhesive 604 may be already pre-formed on the surface 605 of the support 602. The nonconductive layer 140 and the wafer 500 are coupled to the adhesive 604 by a pick and place machine. In some embodiments, the support 602 may be coupled to the nonconductive layer 140 before the support 508 is removed from the first surface 502 of the wafer 500, and after coupling the support 602 to the nonconductive layer 140, the support 508 is removed.

Figure 6B:
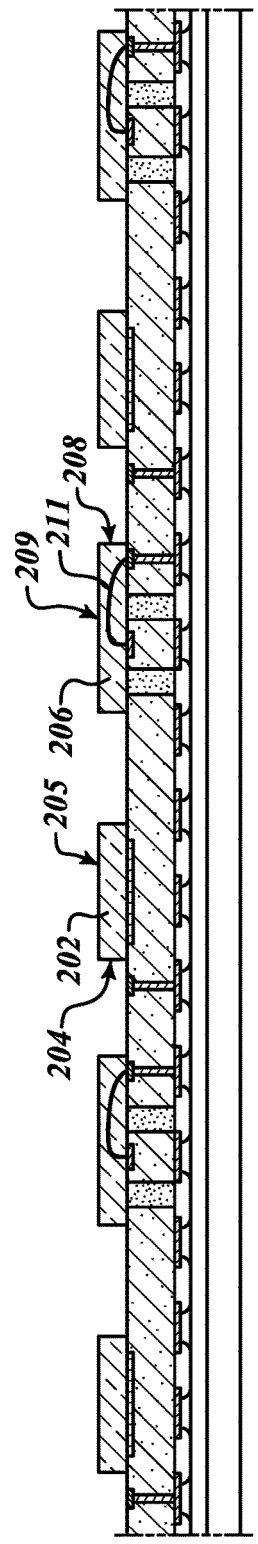

After coupling the nonconductive layer 140 to the support 602, the bonding wires 211, first optically transmissive structures 202, and second optically transmissive structures 206 are formed on the first surface 502 of the wafer 500, which can be seen in FIG. 6B.

The bonding wires 211 may be formed by any wire bonding technique. As discussed with respect to FIG. 2A, the bonding wires 211 are coupled between the light emitters 101 and some of the electrical connections 112 in the wafer 500.

The first optically transmissive structures 202 may be formed by an injection technique, a compression technique, a combination of etching and deposition techniques, or some other formation technique or combination of formation techniques. For example, when a compression formation technique is utilized, a molding tool with openings is placed on the first surface 502 of the wafer 500, and the openings in the molding tool are aligned with the light sensors 100. Then an optically transmissive material is compressed into the openings of the molding tool by a compression formation tool to form the plurality of first optically transmissive structures 202. In some embodiments, the plurality of first optically transmissive structures 202 may be pre-formed and placed by a pick and place machine on the light sensors and coupled to the light sensors by an optically transmissive adhesive.

The second optically transmissive structures 206 may be formed in a similar or same fashion as discussed directly above with respect to the first optically transmissive structures 202. In some embodiments, the second optically transmissive structures 206 may be pre-formed to contain the plurality of bonding wires 211. When the second optically transmissive structures are pre-formed, the second optically transmissive structures are placed by a pick and place machine on the light emitters and coupled to the light emitters 101 by an optically transmissive adhesive.

The first and second optically transmissive structures 202, 206 may be formed at the same time utilizing a molding tool that has some openings aligned with the light sensors 100 and some openings aligned with the light emitters 101. These openings are then filled with the optically transmissive material to form the first optically transmissive structures 202 and the second optically transmissive structure 206.

Figure 6C:
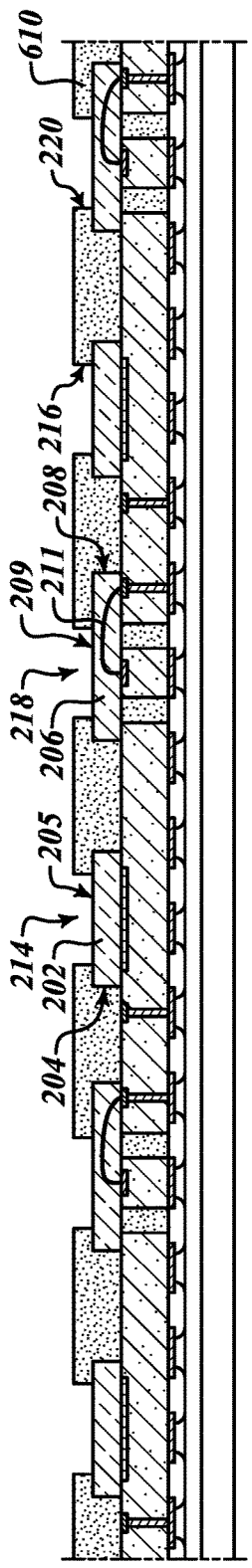

After forming the bonding wires 211 and the optically transmissive structures 202, 206, a molding compound layer 610 is formed on the first surface 502 of the wafer 500 and on the first and second optically transmissive structures 202, 206, which can be seen in FIG. 6C. The molding compound layer 610 forms the molding compound 212 of the package 20 in FIG. 2A. The molding compound layer 610 may be formed by an injection technique, a compression technique, a lamination technique, or some other formation technique or combination of formation techniques. If the molding compound layer 610 is formed by a compression technique, the molding compound is injected onto the first surface 502 of the wafer 500 and the first and second optically transmissive structures 202, 206 and is compressed by a compression molding tool to position the molding compound between the first and the second optically transmissive structures 202, 206.

The first openings 214 and second openings 218 are formed in the molding compound. The first openings 214 are aligned with the light sensors 100 and the first optically transmissive structures 202. The second openings 218 are aligned with the light emitters 100 and the second optically transmissive structures 206. The first openings 214 and the second openings 218 may be formed by a drilling technique, a sawing technique, an etching technique, or some other formation technique.

In some embodiments, a molding tool formation technique is utilized to form the molding compound layer 610, the first openings 214, and the second openings 218 all at the same time. In the molding tool formation technique, a molding tool is placed on the first optically transmissive structures 202, the second optically transmissive structures 206, and the first surface 504 of the wafer 500. After the molding tool is placed, the molding compound layer 610 is formed by forming a molding compound on the molding tool filling openings in the molding tool. The molding tool also includes portions that protrude outward from the molding tool to form the first and second openings 214, 218 while forming the molding compound layer 610 at the same time. In other words, the molding tool defines the shape and size of the molding compound layer 610.

Figure 6D:
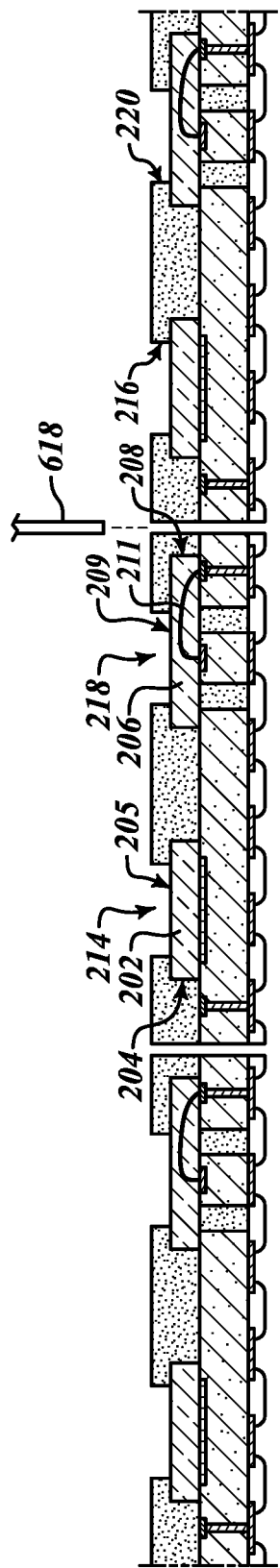

After forming the molding compound layer 610, the first openings 214, and the second openings 218, the wafer 500 is singulated into the packages 20, which can be seen in FIG. 6D. The wafer 500 and the various components on the wafer 500 are singulated at some locations between some of the first optically transmissive structures 202 and some of the second optically transmissive structures 206 by a singulation tool 618. The singulation tool 618 may be a cutting device, a laser device, a saw device, or some other singulation device.

Figure 6E:
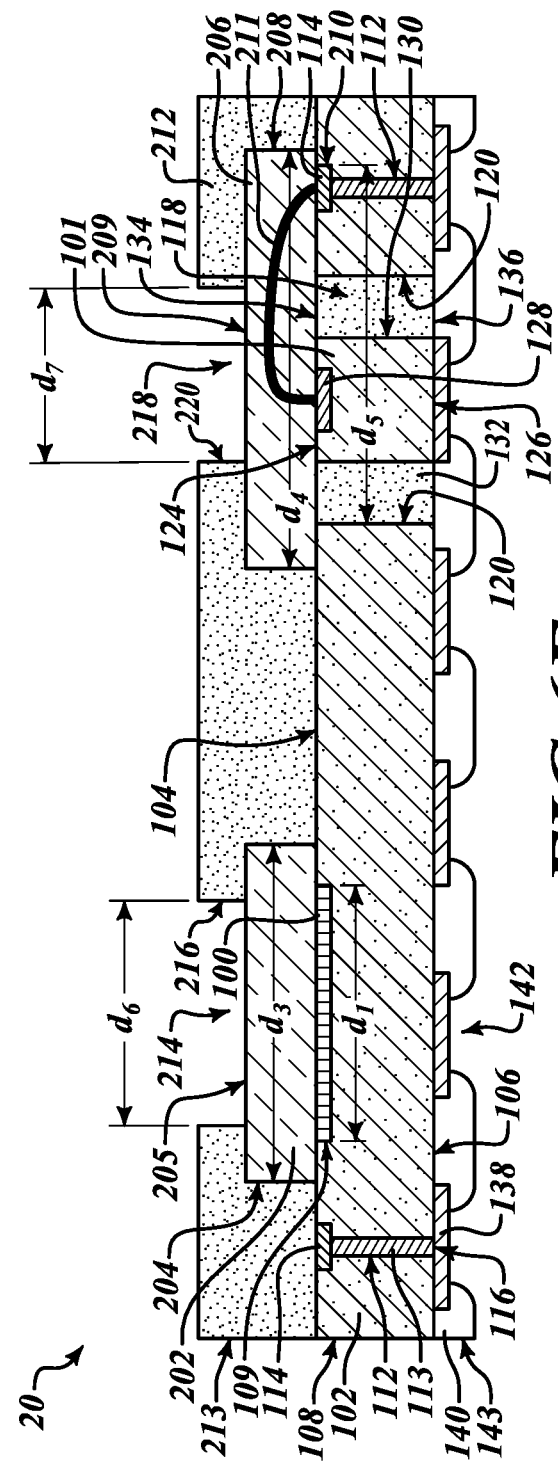

FIG. 6E shows one of the packages 20 formed from the method of manufacturing shown in FIGS. 6A-6D in which the wafer 500 is singulated by the singulation device 618.

FIGS. 7A-7E are cross-sectional views of a method of manufacturing of a plurality of the packages 30 as shown in FIGS. 3A-3B. These cross-sectional views of this embodiment of the method of manufacturing are taken along a line similar to the line 3A-3A in FIGS. 3A-3B with respect to the package 30. The features of this embodiment are the same or similar to the package 30 in FIGS. 3A-3B are represented by the same reference numerals in FIGS. 7A-7E. In this method of manufacturing, the same steps are followed as the method of manufacturing the package 20 up until FIG. 6A.

After coupling the nonconductive layer 140 to the support 602, a molding compound layer 702 is formed on the first surface 502 of the wafer 500, which can be seen in FIG. 7A.

The molding compound layer 702 forms the molding compound 212 of the package 30. The molding compound layer 702 may be formed with a compression technique, an injection technique, a deposition technique, or some other formation technique or combination of formation techniques. If the molding compound layer 702 is formed utilizing a compression molding technique, the molding compound layer 702 is placed on the first surface 502 of the wafer 500 and then is compressed into placed by a compression molding tool.

After the molding compound layer 702 is formed, a plurality of first openings 704 is formed in the molding compound layer 702. The first openings 704 are formed to be aligned with and expose the light sensors 100, respectively. The second openings 706 are formed to be aligned with and expose the light emitters 101, respectively. The first and second openings 704, 706 may be formed by a drilling technique, an etching technique, a cutting technique, a sawing technique, or some other formation technique or combination of formation techniques to remove portions of the molding compound layer 702.

In some embodiments, the first and second openings 704, 706 may be formed when the molding compound layer 702 is formed. For example, when a molding tool formation technique is utilized to form the molding compound layer 702, the first openings 704, and the second openings 706, they are all formed at the same time together. In this molding tool formation technique, a molding tool is placed on the surface 504 of the wafer 500. After the molding tool is placed, the molding compound layer 702 is formed by forming a molding compound on the molding tool filling openings in the molding tool. The molding tool also includes portions that protrude outward from the molding tool to form the first and second openings 704, 706 while forming the molding compound layer 702 at the same time. In other words, the molding tool defines the shape and size of the molding compound layer 702.

After the molding compound layer 702 and the openings 704, 706 are formed, a plurality of the bonding wires 211 are formed in the second openings 706, which can be seen in FIG. 7B. The plurality of bonding wires 211 are formed in a similar fashion as discussed with respect to the plurality of bonding wires 211 in step 608 as shown in FIG. 6B.

After the plurality of bonding wires 211 are formed, a plurality of the first optically transmissive structures 302 and a plurality of the second optically transmissive structures 308 are formed in the openings 704, 706, which can be seen in FIG. 7C. The plurality of first optically transmissive structures 302 are formed in the plurality of first openings 704, and the plurality of second optically transmissive structures 308 are formed in the plurality of second openings 706. The pluralities of first and second optically transmissive structures may be formed by an injection formation technique, a compression formation technique, a deposition formation technique, or some other formation technique. For example, if a compression formation technique is formed, an optically transmissive material is injected into the openings 704, 706 and a compression molding tool is utilized to compress the optically transmissive material into place to form the optically transmissive structures 302, 308.

Figure 7D:
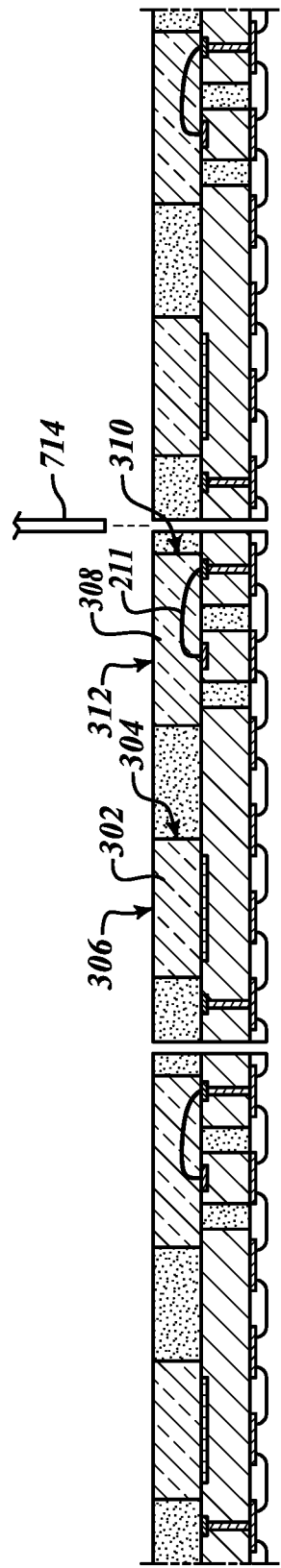

After the pluralities of first and second optically transmissive structures 302, 308 are formed, the wafer 500 and the various components on the wafer 500 are singulated into the packages 30, which can be seen in FIG. 7D. The wafer 500 is singulated between electrical connections 112 of the plurality of electrical connections 112 in the wafer 500. The wafer 500 and the various components on the wafer 500 are singulated at locations between the first optically transmissive structures 302 and the second optically transmissive structures 308 by a singulation tool 714. The singulation tool 714 may be a cutting device, a laser device, a saw device, or some other singulation device.

Figure 7E:
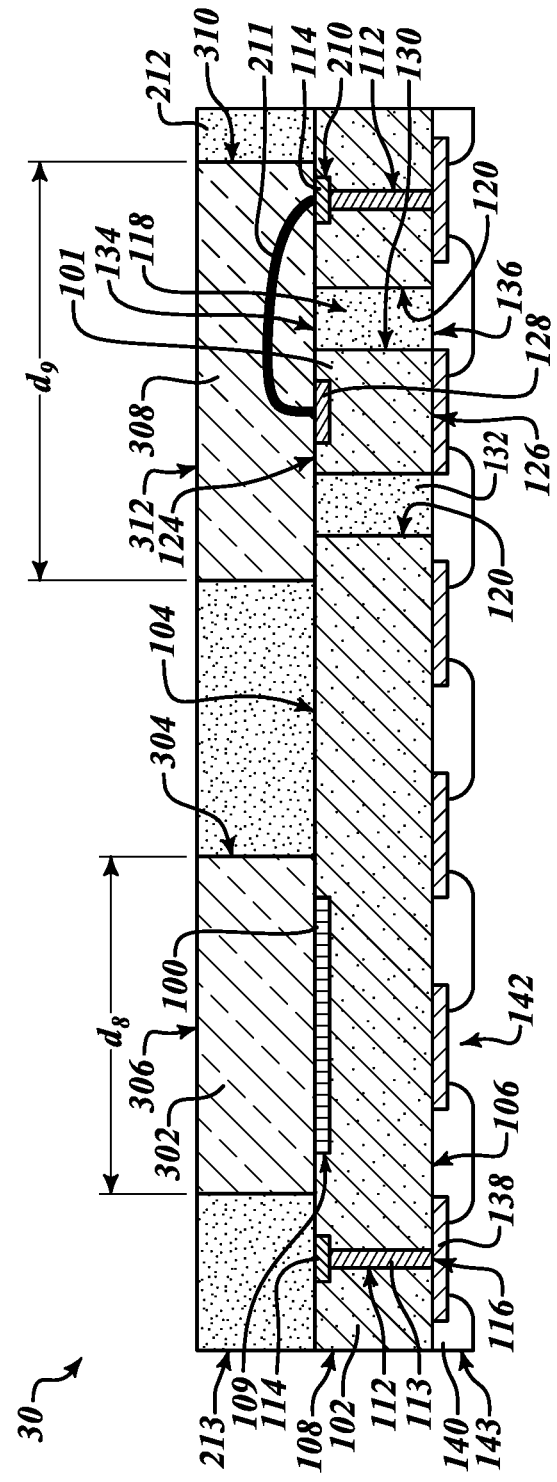

FIG. 7E is one of the packages 30 formed from the method of manufacturing shown in FIGS. 7A-7D in which the wafer 500 and the various components on the wafer 500 are singulated by the singulation device 714. In other words, FIG. 7E is a reproduction of the package 30 in FIG. 3A.

Generally, prior art semiconductor device packages include a light sensor die and a light emitter die that is stacked on the light sensor die. Also, these prior art semiconductor device packages generally include a substrate, a cap, and lenses. The sensor die and the cap are coupled to the substrate, and the light emitter is coupled to a surface of the light sensor die. The cap is coupled to the substrate by an adhesive, and the lenses are coupled to the cap.

Generally, prior art semiconductor device packages have the light emitter die stacked on a surface of the light sensor die and both of these are stacked on a substrate. A cap is then coupled to the substrate to cover both the light sensor die and the light emitter. In contrast, in the present disclosure, the light emitter is embedded in the senor die unlike the stacked formation in the prior art semiconductor device packages. Also, the light sensor die and the embedded light emitter of the present disclosure are not stacked on a substrate that a cap is coupled. Accordingly, the semiconductor device packages of the present disclosure have a reduced profile, thickness, and size when compared to the prior art semiconductor device packages as the light emitter is embedded within the sensor die 102 instead of being stacked on the sensor die 102.

Generally, prior art semiconductor device packages have the cap as discussed above. When the cap covers and protects the light sensor and the light emitter of the prior art semiconductor device packages, a clearance space must be provided between the light sensor and the light emitter in the x-direction, the y-direction, and the z-direction. By removing the requirement of the cap as in the packages 20, 30 of the present disclosure, the packages have a smaller profile in the x-direction, the y-direction, and the z-direction than the prior art semiconductor device packages that include the cap.

The structure of the optical sensing device 10 and the packages 20, 30 of the present disclosure avoids the use of the cap and the substrate of the prior art semiconductor device packages. The packages 20, 30 and the optical sensing device 10 of the present disclosure remove the need for the cap and the substrate of the prior art semiconductor device packages reducing the likelihood of failure due to differences in expansion and contraction, as there are fewer materials in the packages 20, 30 of the present disclosure.

Also, the cap and the substrate of the prior art semiconductor device packages have higher CTEs than the lenses and the die, which generally cause the adhesive to fail due to differences in expansion and contraction between the cap, the substrate, the lenses, and the die of the prior art semiconductor device packages. This failure in the prior art semiconductor packages may cause the cap to become misaligned or to break off of the substrate entirely. Accordingly, the packages 20, 30 and the optical sensing device 10 of the present disclosure are advantageous over these prior art semiconductor packages by avoiding the use of the substrate, the cap, and the adhesive coupling the cap to the substrate.

Examples of possible CTE values of the various components of the structural components of the prior art semiconductor device packages are as follows. The cap may have a coefficient of thermal expansion (CTE) of about 28-ppm/° C., the lenses may have a CTE of about 7-ppm/° C., the die may have a CTE of about 2.8-ppm/° C., the adhesive may have a CTE of about 30-ppm/° C., and the substrate may have a CTE of about 14-ppm/° C.

Examples of possible CTE values of the various components of the structural components of the semiconductor device packages 10, 20, 30 of the present disclosure are as follows. The optically transmissive structures 202, 206, 302, 308 have a coefficient of thermal expansion (CTE) of about 7-ppm/° C. The molding compound 212 has a CTE of about 10-ppm/° C. The semiconductor substrate 102 has a CTE of about 2.8-ppm/° C. These CTEs of these various components are more similar in value relative to the prior art semiconductor device packages. The more similar CTE values of the semiconductor device packages 10, 20, 30 are advantageous over the larger differences in CTE values of various components that make up prior art semiconductor device packages as discussed above. The more similar CTE values of the presently disclosed semiconductor device packages 10, 20, 30 reduces the amount of difference in expansion and contraction between separate structural components of the semiconductor device packages 10, 20, 30, which reduces the likelihood of the expansion and contraction damaging the semiconductor device packages 10, 20, 30.

Generally, prior art semiconductor device packages have lenses coupled to a cap that are aligned with a light emitter and a light sensor. However, if the cap becomes misaligned, as discussed earlier, the light emitted by the light emitter and reflected off of an external object may no longer be able to reach the light sensor. In the present disclosure, the optically transmissive structures are directly on the light sensor and the light emitter. This reduces the likelihood of the light sensor being unable to receive light emitted from the light emitter that is reflected off an external object because the optically transmissive structures are less likely to break off or become misaligned. Even if the optically transmissive structures become slightly misaligned, light will likely be able to still be emitted by the light emitter and received by the light sensor appropriately such that the packages 20, 30 of the present disclosure remain functional. Accordingly, the packages 20, 30 of the present disclosure are more robust than the prior art semiconductor device packages.

The methods described herein may provide many advantages over prior art methods. For example, forming optically transmissive structures and molding compound directly on embedded light sensors and embedded light emitters in a sensor die makes the packages 20, 30 of the present disclosure thinner than prior art packages that utilize a cap, lenses, and a substrate arrangement. Many prior art devices employ such a cap to cover and protect a die, a sensor, and a light emitter. Accordingly, by forming the optically transmissive structures and the molding compound directly on a surface of the sensor die, the overall profile, thickness, and size of the packages 20, 30 may be made smaller and less than prior art semiconductor device packages utilizing a cap and a substrate.

Another advantage of the methods described herein is the increased allowable tolerances over prior art methods. For example, if an optically transmissive material does not completely cover a bonding wire and a molding compound instead covers a portion of the bonding wire, the semiconductor device package including this deformity will still likely be functional as a light emitter and a light sensor of a sensor die will still function. Accordingly, the yield of usable semiconductor device packages formed by utilizing the methods of the present disclosure will be increased when compared to prior art methods of manufacturing.

Another advantage is the avoidance of precise tolerances of prior art methods which can further increase the yield of usable semiconductor device packages. Generally, prior art methods use a pick and place machine with an adhesive to couple a cap to a substrate with a high level of precision. This high level of precision increases manufacturing costs and reduces the yield of usable semiconductor device packages.

While these are some of the advantages of the present disclosure over prior art sensor dies, semiconductor device packages, and methods of manufacturing the same, the above listed advantages are not an exhaustive list and there may be other additional advantages over the prior art sensor die, the semiconductor device packages, and the methods of manufacturing the same.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
   a sensor die having a first surface, a second surface opposite the first surface, and a sensor at the first surface;
   a first opening extending into a portion of the sensor die, the first opening extending fully through the portion of the sensor die from the first surface to the second surface of the sensor die, and the first opening being spaced apart from the sensor of the sensor die;
   a light emitter in the opening having a third surface substantially co-planar with the first surface of the sensor die;
   an optically non-transmissive resin in the opening and on sidewalls of the light emitter, the optically non-transmissive resin extending from the first surface of the sensor die to the second surface of the sensor die, the optically non-transmissive resin including a fourth surface adjacent to the third surface; and
   a first optically transmissive structure on the third surface of the light emitter and on the fourth surface of the optically non-transmissive resin.

2. The device of claim 1, further comprising a molding compound on the first surface of the sensor die and on sidewalls of the first optically transmissive structure, and the sidewalls of the first optically transmissive structure are transverse to the first surface.

3. The device of claim 2, wherein a surface of the molding compound is substantially co-planar with a surface of the first optically transmissive structure, and the surface of the first optically transmissive structure faces away from the sensor die and is transverse to the sidewalls of the first optically transmissive structure.

4. The device of claim 2, wherein the molding compound is at a surface of the first optically transmissive structure and includes a second opening exposing the surface of the first optically transmissive structure, and the surface of the first optically transmissive structure is transverse to the sidewalls of the first optically transmissive structure.

5. The device of claim 1, wherein a second optically transmissive structure is on the sensor of the sensor die.

6. The device of claim 5, further comprising a molding compound on the first surface of the sensor die, on sidewalls of the first optically transmissive structure, and on sidewalls of the second optically transmissive structure.

7. The device of claim 6, wherein a surface of the molding compound is substantially co-planar with a surface of the first optically transmissive structure and a surface of the second optically transmissive structure, the surface of the first optically transmissive structure is transverse to the sidewalls of the first optically transmissive structure, the surface of the second optically transmissive structure is transverse to the sidewalls of the second optically transmissive structure.

8. The device of claim 6, further comprising:
- a second opening in the molding compound exposing a surface of the first optically transmissive structure, the molding compound at the surface of the first optically transmissive structure, and the surface of the first optically transmissive structure transverse to the sidewalls of the first optically transmissive structure; and
- a third opening in the molding compound exposing a surface of the second optically transmissive structure, the molding compound at the surface of the second optically transmissive structure, and the surface of the second optically transmissive structure transverse to the sidewalls of the second optically transmissive structure.

9. The device of claim 1, further comprising a bonding wire in the first optically transmissive structure, and the bonding wire coupling the light emitter to the sensor die.

10. The device of claim 1, wherein the first optically transmissive structure is on the first surface and is on the optically non-transmissive resin.

11. The device of claim 1, wherein the light emitter further includes a fifth surface substantially co-planar with the second surface of the sensor die.

12. A device, comprising:
- a semiconductor substrate having a first surface, a second surface opposite to the first surface, one or more first sidewalls extending from the first surface to the second surface and being transverse to the first and second surfaces, an opening extending fully through the semiconductor substrate from the first surface to the second surface, and the one or more first sidewalls surround the opening;
- a light sensor embedded in the semiconductor substrate at a first portion of the first surface;
- a light emitter die embedded in the semiconductor substrate and within the opening, the light emitter die includes one or more second sidewalls that are spaced inward from the one or more first sidewalls, the light emitter die is at a second portion of the first surface spaced apart from the first portion of the first surface, the light emitter die includes a third surface and an emitter at the third surface facing away from the second surface of the semiconductor substrate;
- an optically non-transmissive resin embedded in the semiconductor substrate and in the opening, the optically non-transmissive resin positioned on the one or more second sidewalls of the light emitter and the one or more first sidewalls of the semiconductor substrate, and the optically non-transmissive resin extends from the first surface of the semiconductor substrate to the second surface of the semiconductor substrate, and the optically non-transmissive resin includes a fourth surface that is adjacent to the third surface and faces away from the second surface of the semiconductor substrate; and
- an optically transmissive structure on the third surface of the light emitter and on the fourth surface of the optically non-transmissive resin.

13. The device of claim 12, wherein the third surface of the light emitter die is substantially co-planar with the first surface of the semiconductor substrate and the fourth surface of the optically non-transmissive resin, and the fourth surface of the optically non-transmissive resin surrounds the third surface of the light emitter die.

14. The device of claim 12, wherein the optically non-transmissive resin extends from the one or more second sidewalls of the light emitter to the one or more first sidewalls of the semiconductor substrate.

15. The device of claim 12, further comprising:
- a bonding pad on the first surface of the semiconductor substrate;
- a contact pad on the second surface of the semiconductor substrate;
- a conductive via in the semiconductor substrate coupling the bonding pad to the contact pad; and
- a conductive trace on the first surface of the semiconductor substrate coupling the bonding pad to the light sensor.

16. A device, comprising:
- a semiconductor substrate having a first surface and a second surface opposite to the first surface;
- an opening in the semiconductor substrate that extends fully through the semiconductor substrate from the first surface to the second surface;
- at least one first sidewall of the semiconductor substrate delimits the opening;
- a light emitter within the opening including at least one second sidewall and a third surface transverse to the at least one second sidewall and at the first surface of the semiconductor substrate;
- an optically non-transmissive resin within the opening and extending fully through the opening, the optically non-transmissive resin covers the at least one first sidewall and covers the at least one second sidewall, the optically non-transmissive resin including a fourth surface that surrounds the third surface of the light emitter; and
- a first optically transmissive portion on the third surface of the light emitter, on the fourth surface of the optically non-transmissive resin, and on the first surface of the semiconductor substrate, the first optically transmissive portion including one or more sidewalls transverse to the first surface of the semiconductor substrate, and the first optically transmissive portion includes a fifth surface spaced apart from the first surface, the third surface, and the fourth surface, and facing away from the first surface, the third surface, and the fourth surface.

17. The device of claim 16, wherein:
the light emitter further includes:
- a sixth surface opposite to the third surface and transverse to the at least one second sidewall;
the third surface is co-planar with the first surface of the semiconductor substrate and co-planar with the fourth surface of the optically non-transmissive resin; and
the sixth surface is substantially coplanar with the second surface of the semiconductor substrate.

18. The device of claim 16, further comprising:
a second optically transmissive portion on the first surface of the semiconductor substrate.

19. The device of claim 18, wherein:
the light emitter includes a light emitter component at the third surface;
the semiconductor substrate includes a light sensor component at the first surface;
the first optically transmissive portion covers the light sensor; and
the second optically transmissive portion covers the light emitter.

20. The device of claim 18, further comprising a bonding wire in the first optically transmissive portion, and the bonding wire couples the light emitter to a conductive via within the semiconductor substrate, and the first optically transmissive portion is on the conductive via.

* * * * *